United States Patent [19]

Krumme et al.

[11] Patent Number: 4,675,472
[45] Date of Patent: Jun. 23, 1987

[54] INTEGRATED CIRCUIT PACKAGE AND SEAL THEREFOR

[75] Inventors: John F. Krumme, Woodside; Darel E. Hodgson, Palo Alto, both of Calif.

[73] Assignee: Beta Phase, Inc., Menlo Park, Calif.

[21] Appl. No.: 892,421

[22] Filed: Aug. 4, 1986

[51] Int. Cl.⁴ .............................................. H05K 5/06
[52] U.S. Cl. ............................... 174/52 FP; 361/388; 361/403; 357/74; 174/52 S
[58] Field of Search .......... 174/52 S, 52 FD, DIG. 8; 357/74; 361/388, 392, 400, 403

[56] References Cited

U.S. PATENT DOCUMENTS

| | | | |
|---|---|---|---|
| 3,422,320 | 1/1969 | Woodling | 174/52 S |
| 3,602,634 | 8/1971 | Meuli | 174/52 FP |
| 3,784,725 | 1/1974 | Perkins et al. | 174/52 S |
| 4,126,758 | 11/1978 | Krumme | 174/52 FP |
| 4,355,463 | 10/1982 | Burns | 174/52 FP |

FOREIGN PATENT DOCUMENTS 0200775  6/1983  German Democratic Rep. ... 174/52 S

Primary Examiner—Roy N. Envall, Jr.
Assistant Examiner—Jeffrey A. Gaffin
Attorney, Agent, or Firm—Burns, Doane, Swecker & Mathis

[57] ABSTRACT

An integrated circuit package having a substrate of ceramic material having a cavity therein, a resilient seal rim connected to the substrate, a lid that may be inserted within said rim and a band of shape-memory alloy surrounding the rim to compress the rim into contact with the lid to seal the package.

13 Claims, 6 Drawing Figures

INTEGRATED CIRCUIT PACKAGE AND SEAL THEREFOR

FIELD OF THE INVENTION

The present invention relates to the field of integrated circuit packages and more particularly to an improved means for sealing such packages.

BACKGROUND OF THE INVENTION

The sealing of integrated circuit packages to prevent contamination and deterioration from the environment is critical in the field of semiconductor packaging. To this end many components are often sealed from the atmosphere by fusing a glass layer over the components or in the alternative by soldering a metal lid over a substrate on which a semiconductor chip has been mounted. Such methods of sealing unfortunately subject the component to be protected to considerable thermal stress during the process of fusing or soldering and do not allow non-destructive reopening of the package for rework.

U.S. Pat. No. 4,126,758 discloses my earlier method and apparatus for sealing electrical components by positioning over an electrical component a heat-recoverable sealing lid. Upon recovery the lid 14 expands to seal against an upstanding ring 18 that is attached to the package. It can be appreciated that such a design requires precision tolerances between a heat-recoverable lid and the ring to effect the seal and that the greater the forces generated by the heat-recoverable lid, the greater the chances that the lid will destroy the interface between the ring and the substrate of the package especially in thermal cycling over time which occurs each time the device is turned on and off.

It would therefore be highly desirable to have an integrated circuit package that could utilize the benefits of a heat-recoverable material such as a shape-memory alloy to effect an environmental seal without requiring precise tolerances and without jeopardizing the integrity of the package due to the sealing forces generated by the heat-recoverable member. The instant invention provides such an improved package and in certain configurations allows simple non-destructive re-entry to the package for rework and subsequent resealing.

SUMMARY OF THE INVENTION

The purpose of the instant invention is to provide an integrated circuit package that may be readily environmentally sealed. To accomplish this purpose there is provided an integrated circuit package having a seal rim, a lid that seats within said seal rim and a band of shape-memory alloy which surrounds the seal rim and which upon recovery presses the seal rim into engagement with the lid, wherein the greater the forces of recovery, the greater the effective seal between said seal rim and said lid.

Another aspect of the invention provides an integrated circuit package comprising:

a substrate of material having a coefficient of thermal expansion, said substrate having a cavity therein defined by a bottom and upstanding walls and having conductors operatively connected thereto for electrical interconnection of a component to be inserted within said cavity;

a seal rim connected to said walls, said rim having an inside surface and an outside surface, said inside surface defining said opening, said rim fabricated from a material having a coefficient of thermal expansion compatible with the coefficient of thermal expansion of the substrate;

a lid having an outer periphery that is complementary with said inside surface, said lid being insertable within said opening; and a band of shape-memory alloy having a martensite state and an austenite state, said band capable of being expanded dimensionally while in its martensite state to fit outside of said outside surface of said seal rim, a change from its martensite state to its austenite state capable of recovering said band to its non-expanded dimension operatively pressing said seal rim against the outer periphery of said lid to effect sealing.

Yet another aspect of the invention provides an integrated circuit package seal comprising:

a seal rim capable of being connected to the upper surface of a substrate having a cavity therein to receive an electrical component, said rim having an inside surface and an outside surface, said inside surface defining said opening, said rim fabricated from a material having a coefficient of thermal expansion compatible with the coefficient of thermal expansion of a substrate upon which the seal rim may be connected;

a lid having an outer periphery that is complimentary with said inside surface, said lid being insertable within said opening; and a band of shape-memory alloy having a martensite state and an austenite state, said band capable of being expanded dimensionally while in its martensite state to fit outside of said outside surface of said seal rim, a change from its martensite state to its austenite state capable of recovering said band to its non-expanded dimension operatively pressing said seal rim against the outer periphery of said lid to effect sealing.

Still yet another aspect of the invention provides an integrated circuit package comprising:

a substrate of material having a coefficient of thermal expansion, said substrate having a cavity therein defined by a bottom and upstanding walls and having conductors operatively connected thereto for electrical interconnection of a component to be inserted within said cavity;

a seal rim connected to said walls, said rim having an inside surface and an outside surface, said inside surface defining said opening, said rim fabricated from a material having a coefficient of thermal expansion compatible with the coefficient of thermal expansion of the substrate;

a lid having an outer periphery that is complimentary with said outside surface, said lid being insertable over said rim; and a band of shape-memory alloy having a martensite state and an austenite state, said band capable of being expanded dimensionally while in its martensite state to fit outside of said lid, a change from its martensite state to its austenite state capable of recovering said band to its non-expanded dimension operatively pressing said lid against the seal rim to effect sealing.

DETAILED DESCRIPTION OF THE PREFERRED EMBODIMENT

Figure 1:
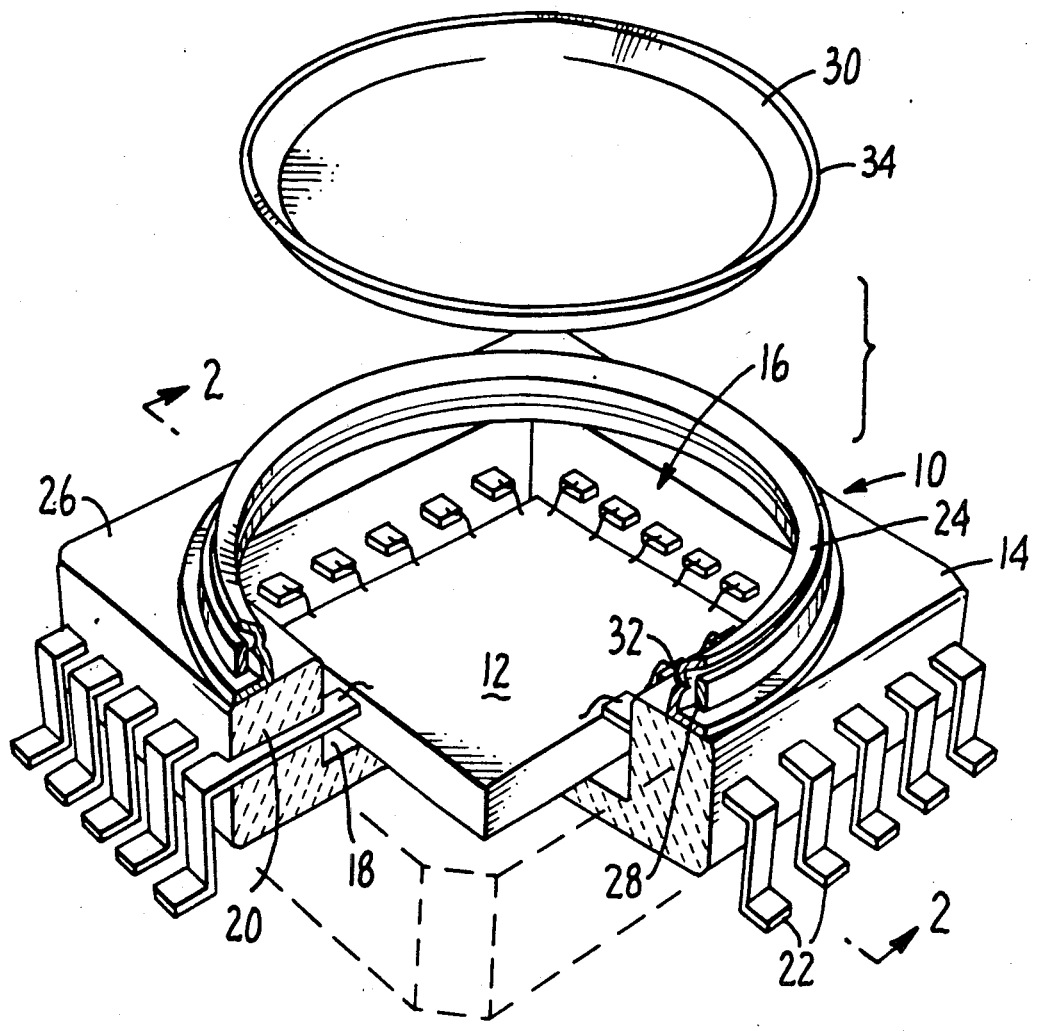
FIG. 1 is a partial perspective view of the integrated circuit package of the instant invention.
Figure 2:
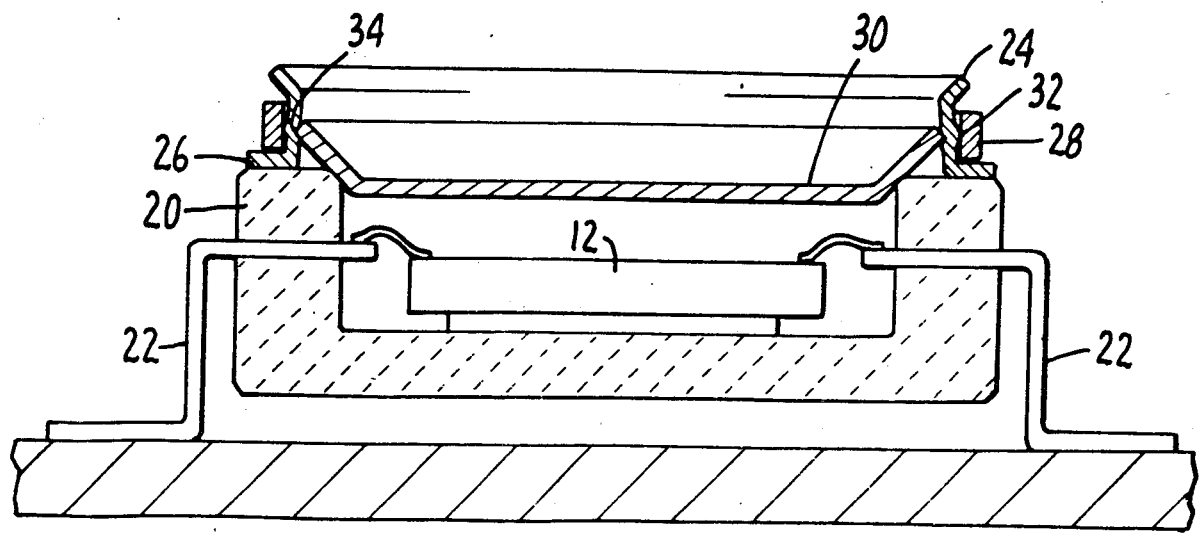
FIG. 2 is a cross-sectional view taken along cross section lines 2—2 in FIG. 1.

With continued reference to the drawing, FIG. 1 illustrates an integrated circuit package shown generally at 10 having a semiconductor chip 12 positioned therein. Package 10 includes a substrate 14 of ceramic material the substrate having a cavity shown generally at 16 defined by a bottom 18 and upstanding walls 20. As shown, conductors 22 are operatively connected to and as shown to be through the substrate for electrical connection of the component chip 12 that is contained within the cavity 16.

A seal rim 24 is connected and specifically bonded to the top of the walls 20 by known techniques such as brazing to a metalized surface on the top of the walls 20. Substrate 14 material may be, but is not limited to, material made of any insulative material including inorganic insulators such as ceramics, glass or organic insulators such as epoxy, phenolic, and polyarylene. Substrate 14 may also be made of metal such as steel or aluminum for microwave packages or other integrated circuit packages. It is within the scope of such embodiments to have the seal rim 24 integral with the substrate 14. When organic insulators are used as the substrate material, reinforcing agents such as glass fiber where microspheres are desirable to impart required rigidity to the electronic package. Ring 24 is preferably formed from a metal such as alloy 42 or Kovar. The ring is capable of being brazed to surface 26. Most importantly, the ring 24 and the substrate 14 have substantially identical coefficients of thermal expansion.

A band 28 of shape-memory alloy surrounds seal rim 24 and upon recovery compresses the seal rim inwardly to engage a package lid 30. Seal rim 24 preferably has a generally "U" shaped cross section and band 28 is seated within said "U" shape. The seal rim 24 may also be more "L" shaped to provide sufficient bottom surface for joining with substrate 14 yet providing minimal interference with the application of band 28 before band 28 is recovered from its deformed martensite state to which it is expanded.

Band 28 is preferably formed of a shape-memory alloy having a martensite state and an austenite state the band being capable of expanding dimensionally outwardly while in the martensite state to fit around seal rim 24. A change from the martensite state to the austenite state recovers the ring to its non-expanded dimension to press the seal rim 24 inwardly to engage package lid 30.

Ring 28 is preferably made from a shape-memory alloy although it is understood that non-memory metallic materials exhibiting shape memory are within the scope of the invention. Materials, both organic and metallic, possessing shape memory are well known. An article made from such materials can be deformed from an original, heat-stable configuration to a second, heat-unstable configuration. The article is said to have shape memory for the reason that upon the application of heat alone it can be caused to revert, or to attempt to revert, from its heat-unstable configuration to its original, heat-stable configuration, i.e., it "remembers" its original shape.

Among metallic alloys, the ability to display shape memory is a result of the fact that the alloy undergoes a reversible transformation from an austenite state to a martensite state with a decrease in temperature. An article made from such an alloy is easily deformed from its original configuration to a new configuration when cooled to a temperature below which the alloy is transformed from the austenite state to the martensite state.

One alloy of the type that may be used to fabricate band 28 is the subject of U.S. Pat. No. 3,351,463, which is incorporated herein by reference. Other literature describing the processing and characteristics of suitable compositions includes an article by Dr. William J. Buehler, the principal developed of the material, and William B. Cross, entitled "55 Nitenol-Unique Alloy Wire," which appeared in the June 1969 issue of *Wire Journal*. A description of the materials and certain of the properties may also be found in the brochure entitled "Nitenol Characterization Studies" dated September 1969. This document, identified as N-69-36367, or NASA CR-1433 is available from the Clearninghouse for Scientific and Technical Information, Springfield, Va. 22151. The disclosure of all of the publications is incorporated herein by reference.

It can be seen that recovery of band 28 compresses seal rim 24 into engagement with lid 30. It can also be appreciated that in general the greater the force exerted by band 28 the greater the sealing force between the seal rim 24 and the package lid 30. As contrasted to U.S. Pat. No. 4,126,758 discussed earlier, the sealing force in the instant invention does not act directly against the seal rim to dislodge the rim from the substrate 14. The inward radial sealing forces are offset by the package lid creating a balance of the forces to the brazed joint between ring 24 and substrate 14.

Package lid 30 is provided in its manufacture with a sealing edge 34 of a sharp corner designed to allow plastic deformation of the surface of seal ring 24 upon sealing.

Figure 3:
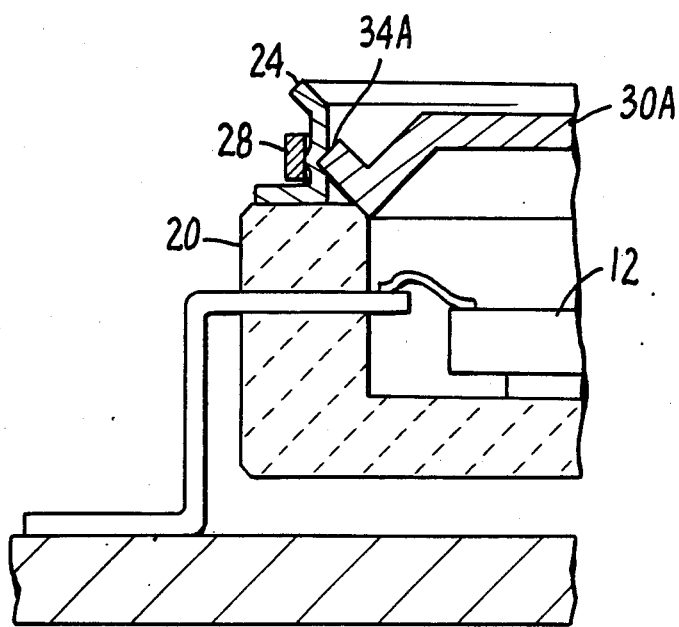
FIG. 3 is a partial cross-sectional view similar to FIG. 2 of an alternate embodiment of a lid.
Figure 4:
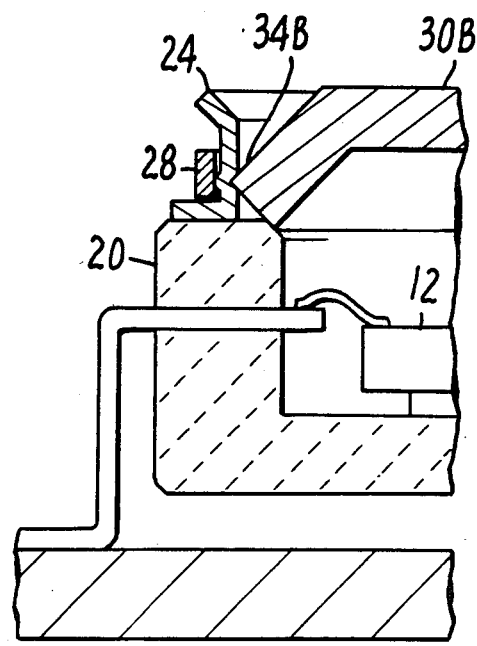
FIG. 4 is a partial cross-sectional view similar to FIG. 2 of yet another alternate embodiment of a lid.

The package lid 30 can also be provided in several alternate geometries such as shown in FIGS. 3 and 4 wherein the sharp edges 34A and 34B, respectively, engage the seal ring by resting on the upstanding wall 20.

Figure 5:
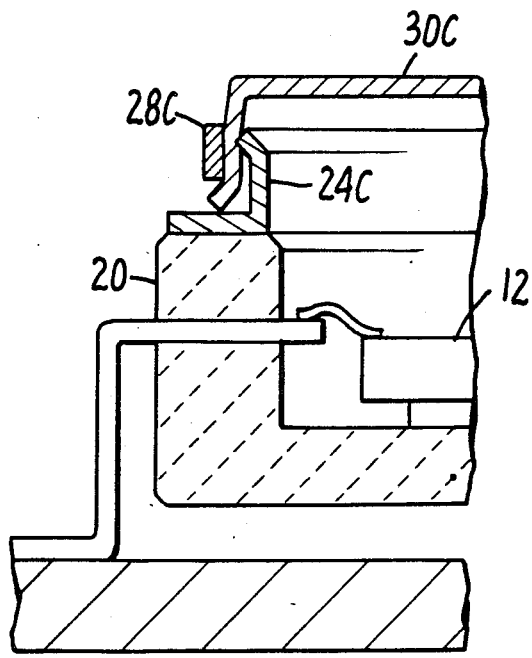
FIG. 5 is a partial cross-sectional view similar to FIG. 2 of an alternate embodiment of ring, lid and band.

FIG. 5 illustrates an alternate embodiment of seal ring 24C, lid 30C and band 28C wherein a very thin lid of almost any material, even a plastic part having a diffusion barrier, e.g., a sputtered metal coating on the inside, to give adequate sealing is employed. In this embodiment the seal ring 24C is fairly resilient and requires a relatively small shape-memory alloy band 28C to effect a seal.

Figure 6:
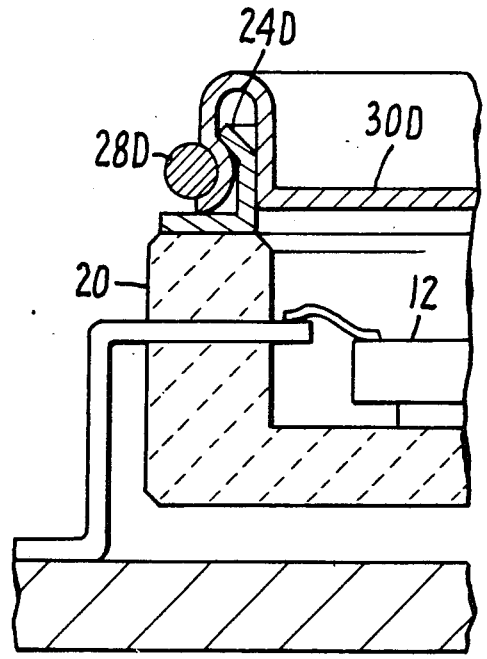
FIG. 6 is a partial cross-sectional view similar to FIG. 2 of yet another embodiment of ring, lid and band.

FIG. 6 illustrates yet another embodiment of seal ring 24D, lid 30D and band 28D. Although the band 28D engages the lid 30D and not the seal ring 24D directly, as in FIGS. 1–4, it can be seen that the inward sealing forces are also off-set by the package lid creating a balancing of forces, as in those embodiments. The outer periphery of the lid 30D is therefore also complementary with the outside surface of seal ring 24D and the band 28D operatively presses the seal rim 24D against the outer periphery of the lid 30D. It can also be seen in this figure that band 28D may be of round cross-section. Band 28D may be made from a wire of Nitinol which is welded to itself to form a ring. It is within the scope of the invention to fabricate the bands of any desired cross-section to enhance the sealing of the lid to the seal ring.

To reopen the sealed package, the bands 28, 28A, 28B, 28C and 28D may be cut and discarded. The respective lid for each embodiment may then be removed exposing the chip 12 and conductor 22 joints for rework. A new band is then used to reseal the same lid.

While the invention has been particularly shown and described with reference to the preferred embodiment thereof, it will be understood by those skilled in the art that the foregoing and other changes in form and details may be made therein without departing from the spirit and scope of the invention, limited only by a just interpretation of the following claims.

What is claimed is:

1. An integrated circuit package comprising:
   a substrate of material having a coefficient of thermal expansion, said substrate having a cavity therein defined by a bottom and upstanding walls and having conductors operatively connected thereto for electrical interconnection of a component to be inserted within said cavity;
   a seal rim connected to said walls, said rim having an inside surface and an outside surface, said inside surface defining said opening, said rim fabricated from a material having a coefficient of thermal expansion compatible with the coefficient of thermal expansion of the substrate;
   a lid having an outer periphery that is complimentary with said inside surface, said lid being insertable within said opening; and
   a band of shape-memory alloy having a martensite state and an austenite state, said band capable of being expanded dimensionally while in its martensite state to fit outside of said outside surface of said seal rim, a change from its martensite state to its austenite state capable of recovering said band to its non-expanded dimension for operatively pressing said seal rim against the outer periphery of said lid to effect sealing.

2. A package as in claim 1 wherein said seal rim has a generally "U" shaped cross-section said band seating within the confines of said "U" shape.

3. A package as in claim 1 wherein said seal rim has generally an "L" shaped cross-section.

4. A package as in claim 1 wherein said band has a round cross-section and comprises a wire that is welded to itself to form a ring.

5. A package as in claim 1 wherein the outer periphery of said lid is also complementary with said outside surface of the lid.

6. An integrated circuit package seal comprising:
   a seal rim capable of being connected to the upper surface of a substrate having a cavity therein to receive an electrical component, said rim having an inside surface and an outside surface, said inside surface defining said opening, said rim fabricated from a material having a coefficient of thermal expansion compatible with the coefficient of thermal expansion of a substrate upon which the seal rim may be connected;
   a lid having an outer periphery that is complimentary with said inside surface, said lid being insertable within said opening; and
   a band of shape-memory alloy having a martensite state and an austenite state, said band capable of being expanded dimensionally while in its martensite state to fit outside of said outside surface of said seal rim, a change from its martensite state to its austenite state capable of recovering said band to its non-expanded dimension for operatively pressing said seal rim against the outer periphery of said lid to effect sealing.

7. A package seal as in claim 6 wherein said seal rim has a generally "U" shaped cross-section said band seating within the confines of said "U" shape.

8. A package seal as in claim 6 wherein said seal rim has generally an 37 L" shaped cross-section.

9. A package seal as in claim 6 wherein said band has a round cross-section and comprises a wire that is welded to itself to form a ring.

10. A package seal as in claim 6 wherein the outer periphery of said lid is also complementary with said outside surface of the lid.

11. A package seal as in claim 6 wherein said seal rim and said substrate upstanding walls are integral.

12. An integrated circuit package comprising:
    a substrate of material having a coefficient of thermal expansion, said substrate having a cavity therein defined by a bottom and upstanding walls and having conductors operatively connected thereto for electrical interconnection of a component to be inserted within said cavity;
    a seal rim connected to said walls, said rim having an inside surface and an outside surface, said inside surface defining said opening, said rim fabricated from a material having a coefficient of thermal expansion compatible with the coefficient of thermal expansion of the substrate;
    a lid having an outer periphery that is complimentary with said outside surface, said lid being insertable over said rim; and
    a band of shape-memory alloy having a martensite state and an austenite state, said band capable of being expanded dimensionally while in its martensite state to fit outside of said lid, a change from its martensite state to its austenite state capable of recovering said band to its non-expanded dimension operatively pressing said lid against the seal rim to effect sealing.

13. A package as in claim 12 wherein the upstanding walls of said substrate and said seal rim are integral.

* * * * *

UNITED STATES PATENT AND TRADEMARK OFFICE
CERTIFICATE OF CORRECTION

PATENT NO. : 4,675,472

DATED : June 23, 1987

INVENTOR(S) : John F. Krumme et al.

It is certified that error appears in the above-identified patent and that said Letters Patent is hereby corrected as shown below:

Column 3, line 26, following "phenolic," insert --melamine, nylon, polyesters, Teflon, polyimides--.

Column 3, lines 59 and 60, "non-memory metallic" should be --non-metallic--.

Column 4, line 17, "Nitenol" should be --Nitinol--.

Column 4, line 21, "Nitenol" should be --Nitinol--.

Column 4, line 23, "Clearninghouse" should be --Clearinghouse--.

Column 6, line 5, "complimentary" should be --complementary--.

Column 6, line 21, "37 L"" should be --"L"--.

Column 6, line 44, "complimentary" should be --complementary--.

Signed and Sealed this

Sixth Day of September, 1988

Attest:

DONALD J. QUIGG

Attesting Officer

Commissioner of Patents and Trademarks